United States Patent
Moon et al.

(10) Patent No.: US 8,368,634 B2
(45) Date of Patent: Feb. 5, 2013

(54) GATE DRIVER FOR PARTIALLY DRIVING A SCREEN

(75) Inventors: Su Hwan Moon, Gumi-si (KR); Ji Eun Chae, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 377 days.

(21) Appl. No.: 12/654,264

(22) Filed: Dec. 15, 2009

(65) Prior Publication Data

US 2010/0156858 A1    Jun. 24, 2010

(30) Foreign Application Priority Data

Dec. 19, 2008  (KR) .......................... 10-2008-130084

(51) Int. Cl.
*G09G 3/36* (2006.01)
(52) U.S. Cl. ........................................ 345/100; 345/204
(58) Field of Classification Search .................... 345/98, 345/100, 204
See application file for complete search history.

(56) References Cited

U.S. PATENT DOCUMENTS

| 7,663,580 B2 * | 2/2010 | Shin ................................ 345/82 |
| 2007/0057899 A1 * | 3/2007 | Yamashita .................... 345/100 |
| 2007/0296676 A1 * | 12/2007 | Moon et al. ..................... 345/98 |

FOREIGN PATENT DOCUMENTS

GB    EP0319292 A2 *   7/1989

* cited by examiner

*Primary Examiner* — Chanh Nguyen
*Assistant Examiner* — Kwang-Su Yang
(74) *Attorney, Agent, or Firm* — McKenna Long & Aldridge LLP

(57) ABSTRACT

Disclosed herein is a gate driver which is capable of partially driving a screen. The gate driver includes a first shift register for sequentially outputting n scan pulses (where n is a natural number larger than 2), and a second shift register for selecting p ones (where p is a natural number smaller than or equal to n) of the n scan pulses from the first shift register in response to an external output control signal and supplying the selected p scan pulses respectively to p gate lines of a liquid crystal panel.

10 Claims, 6 Drawing Sheets

GATE DRIVER FOR PARTIALLY DRIVING A SCREEN

CROSS-REFERENCE TO RELATED APPLICATION

This application claims the benefit of Korean Patent Application No. 10-2008-0130084 filed on Dec. 19, 2008 which is hereby incorporated by reference as if fully set forth herein.

BACKGROUND OF THE INVENTION

1. Field of the Invention

The present invention relates to a gate driver, and more particularly, to a gate driver which is capable of partially driving a screen.

2. Discussion of the Related Art

In general, a liquid crystal display device is adapted to display an image by adjusting light transmittance of a liquid crystal using an electric field. To this end, the liquid crystal display device includes a liquid crystal panel having pixel areas arranged in matrix form, and a driving circuit for driving the liquid crystal panel.

In the liquid crystal panel, a plurality of gate lines and a plurality of data lines are arranged to intersect each other, and pixel areas are located respectively in areas defined by the intersections of the gate lines and the data lines. A pixel electrode and a common electrode for application of an electric field to each of the pixel areas are formed in the liquid crystal panel.

Each pixel electrode is connected to a corresponding one of the data lines via the source terminal and drain terminal of a thin film transistor (TFT), which is a switching device. The TFT is turned on by a scan pulse applied to the gate terminal thereof via a corresponding one of the gate lines to charge a data signal from the corresponding data line in the pixel electrode.

The driving circuit includes a gate driver for driving the gate lines, a data driver for driving the data lines, a timing controller for supplying control signals for control of the gate driver and data driver, and a power supply for supplying various driving voltages to be used in the liquid crystal display device.

The gate driver sequentially supplies scan pulses to the gate lines to sequentially drive pixels in the liquid crystal panel on a line-by-line basis.

On the other hand, when the liquid crystal display device is driven, it is common that the gate lines are all driven. However, in some cases, it may be necessary to display an image on only a portion of a screen. A conventional gate driver has a disadvantage in that it cannot drive the gate lines such that an image is displayed on only a portion of a screen.

SUMMARY OF THE INVENTION

Accordingly, the present invention is directed to a gate driver that substantially obviates one or more problems due to limitations and disadvantages of the related art.

An object of the present invention is to provide a gate driver which has a second shift register capable of selectively outputting only desired ones of all scan pulses outputted from a first shift register.

Additional advantages, objects, and features of the invention will be set forth in part in the description which follows and in part will become apparent to those having ordinary skill in the art upon examination of the following or may be learned from the practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a gate driver includes: a first shift register for sequentially outputting n scan pulses (where n is a natural number larger than 2); and a second shift register for selecting p ones (where p is a natural number smaller than or equal to n) of the n scan pulses from the first shift register in response to an external output control signal and supplying the selected p scan pulses respectively to p gate lines of a liquid crystal panel.

The first shift register may include n A stages for sequentially outputting the n scan pulses based on any one of at least two types of A clock pulses which are outputted sequentially out of phase with each other, an upper dummy stage for outputting an upper dummy scan pulse based on any one of the A clock pulses, and a lower dummy stage for outputting a lower dummy scan pulse based on any one of the A clock pulses, and the second shift register may include n B stages for receiving any one of at least two types of B clock pulses which are outputted sequentially out of phase with each other, the n scan pulses from the A stages, the upper dummy scan pulse from the upper dummy stage, and the lower dummy scan pulse from the lower dummy stage. Here, a kth one (where k is a natural number) of the n B stages may output a scan pulse from a kth one of the n A stages as any one of the B clock pulses in response to the output control signal.

Each of the A stages may output a corresponding one of the n scan pulses for an output period thereof. Here, only scan pulses from A stages whose output periods are located in an enable duration of the output control signal where the output control signal is maintained in a high state, among the n A stages, may be supplied respectively to corresponding ones of the gate lines of the liquid crystal panel through corresponding ones of the B stages.

A high edge point of the enable duration of the output control signal may be ahead of a high edge point of a high duration of a scan pulse output earliest in the enable duration.

A time difference between the high edge point of the enable duration of the output control signal and the high edge point of the high duration of the scan pulse output earliest in the enable duration may correspond to one horizontal time.

The A clock pulses may be supplied to the A stages, the upper dummy stage and the lower dummy stage over an entire period including the enable duration of the output control signal, and the B clock pulses may be supplied to the B stages in only the enable duration of the output control signal.

Alternatively, the A clock pulses may be supplied to the A stages, the upper dummy stage and the lower dummy stage over an entire period including the enable duration of the output control signal, and the B clock pulses may be supplied to the B stages over the entire period including the enable duration of the output control signal.

The A clock pulses and the B clock pulses may be the same signals.

The upper dummy stage may set or reset a first one of the A stages of the first shift register and a first one of the B stages of the second shift register in response to an external start pulse, and the lower dummy stage may reset or set an nth one of the A stages of the first shift register and an nth one of the B stages of the second shift register in response to the start pulse. Here, the lower dummy stage may reset when the upper dummy stage sets, and set when the upper dummy stage resets.

A (k+1)th one of the A stages may include: a first switching device turned on or off in response to the scan pulse from the kth A stage, the first switching device interconnecting a set node and a charging voltage line when being turned on, the charging voltage line transferring a charging voltage; a second switching device turned on or off in response to a first alternating current (AC) voltage from a first AC voltage line, the second switching device interconnecting the first AC voltage line and a first reset node when being turned on; a third switching device turned on or off according to a voltage state of the first reset node, the third switching device interconnecting the set node and a discharging voltage line when being turned on, the discharging voltage line transferring a discharging voltage; a fourth switching device turned on or off according to a voltage state of the set node, the fourth switching device interconnecting the first reset node and the discharging voltage line when being turned on; a fifth switching device turned on or off in response to the scan pulse from the kth A stage, the fifth switching device interconnecting the first reset node and the discharging voltage line when being turned on; a sixth switching device turned on or off in response to a second AC voltage from a second AC voltage line, the sixth switching device interconnecting the first reset node and the discharging voltage line when being turned on; a seventh switching device turned on or off in response to the second AC voltage from the second AC voltage line, the seventh switching device interconnecting the second AC voltage line and a second reset node when being turned on; an eighth switching device turned on or off according to a voltage state of the second reset node, the eighth switching device interconnecting the set node and the discharging voltage line when being turned on; a ninth switching device turned on or off according to the voltage state of the set node, the ninth switching device interconnecting the second reset node and the discharging voltage line when being turned on; a tenth switching device turned on or off in response to the scan pulse from the kth A stage, the tenth switching device interconnecting the second reset node and the discharging voltage line when being turned on; an eleventh switching device turned on or off in response to the first AC voltage from the first AC voltage line, the eleventh switching device interconnecting the second reset node and the discharging voltage line when being turned on; a twelfth switching device turned on or off in response to a scan pulse from a (k+2)th one of the A stages, the twelfth switching device interconnecting the set node and the discharging voltage line when being turned on; a pull-up switching device turned on or off according to the voltage state of the set node, the pull-up switching device interconnecting a clock transfer line transferring any one of the A clock pulses and an output terminal of the (k+1)th A stage when being turned on; a first pull-down switching device turned on or off according to the voltage state of the first reset node, the first pull-down switching device interconnecting the output terminal of the (k+1)th A stage and the discharging voltage line when being turned on; and a second pull-down switching device turned on or off according to the voltage state of the second reset node, the second pull-down switching device interconnecting the output terminal of the (k+1)th A stage and the discharging voltage line when being turned on.

A (k+1)th one of the B stages may include: a first switching device turned on or off in response to the scan pulse from the kth A stage, the first switching device interconnecting a set node and a control signal line when being turned on, the control signal line transferring the output control signal; a second switching device turned on or off in response to a first AC voltage from a first AC voltage line, the second switching device interconnecting the first AC voltage line and a first reset node when being turned on; a third switching device turned on or off according to a voltage state of the first reset node, the third switching device interconnecting the set node and a discharging voltage line when being turned on, the discharging voltage line transferring a discharging voltage; a fourth switching device turned on or off according to a voltage state of the set node, the fourth switching device interconnecting the first reset node and the discharging voltage line when being turned on; a fifth switching device turned on or off in response to the scan pulse from the kth A stage, the fifth switching device interconnecting the first reset node and the discharging voltage line when being turned on; a sixth switching device turned on or off in response to a second AC voltage from a second AC voltage line, the sixth switching device interconnecting the first reset node and the discharging voltage line when being turned on; a seventh switching device turned on or off in response to the second AC voltage from the second AC voltage line, the seventh switching device interconnecting the second AC voltage line and a second reset node when being turned on; an eighth switching device turned on or off according to a voltage state of the second reset node, the eighth switching device interconnecting the set node and the discharging voltage line when being turned on; a ninth switching device turned on or off according to the voltage state of the set node, the ninth switching device interconnecting the second reset node and the discharging voltage line when being turned on; a tenth switching device turned on or off in response to the scan pulse from the kth A stage, the tenth switching device interconnecting the second reset node and the discharging voltage line when being turned on; an eleventh switching device turned on or off in response to the first AC voltage from the first AC voltage line, the eleventh switching device interconnecting the second reset node and the discharging voltage line when being turned on; a twelfth switching device turned on or off in response to a scan pulse from a (k+2)th one of the A stages, the twelfth switching device interconnecting the set node and the discharging voltage line when being turned on; a pull-up switching device turned on or off according to the voltage state of the set node, the pull-up switching device interconnecting a clock transfer line transferring any one of the B clock pulses and an output terminal of the (k+1)th B stage when being turned on; a first pull-down switching device turned on or off according to the voltage state of the first reset node, the first pull-down switching device interconnecting the output terminal of the (k+1)th B stage and the discharging voltage line when being turned on; and a second pull-down switching device turned on or off according to the voltage state of the second reset node, the second pull-down switching device interconnecting the output terminal of the (k+1)th B stage and the discharging voltage line when being turned on.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
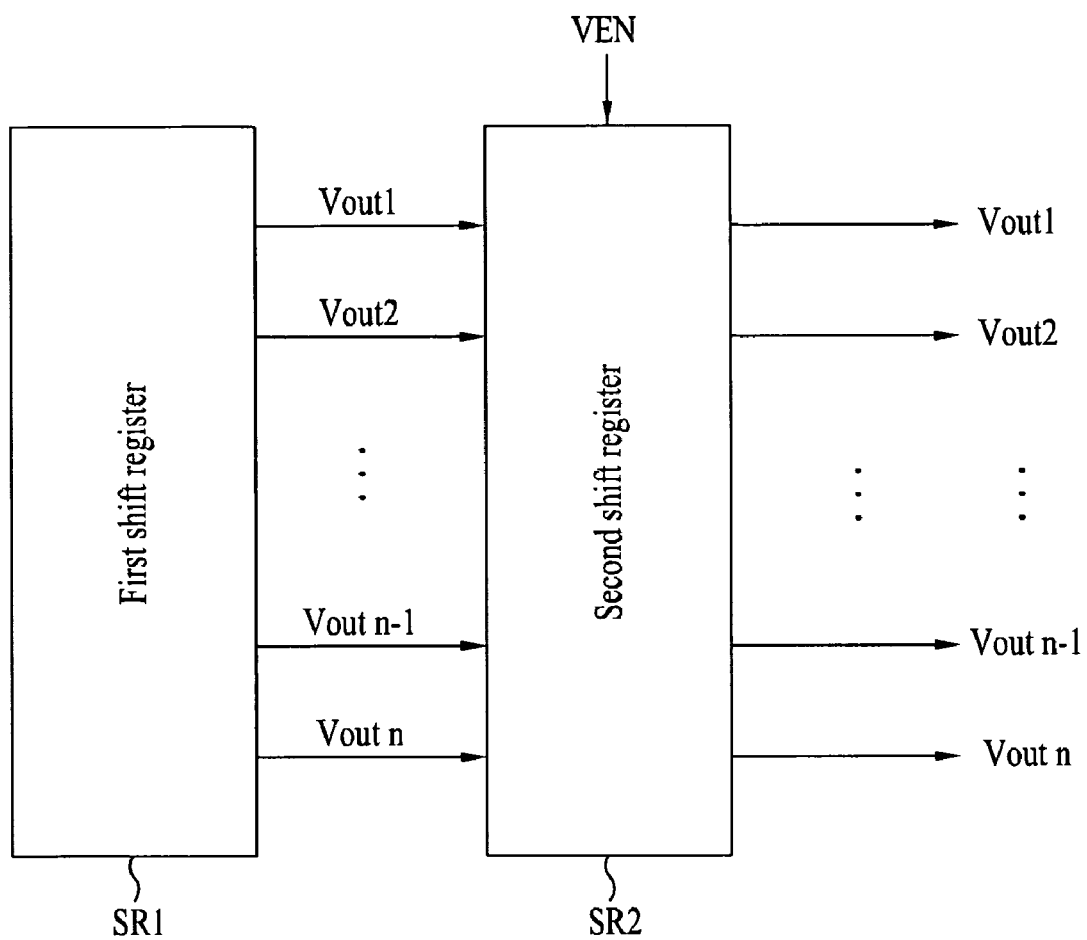
FIG. 1 is a schematic block diagram of a gate driver according to an exemplary embodiment of the present invention.

FIG. 1 is a schematic block diagram of a gate driver according to an exemplary embodiment of the present invention.

The gate driver according to the present embodiment includes, as shown in FIG. 1, a first shift register SR1 for sequentially outputting n scan pulses Vout1 to Voutn (where n is a natural number larger than 2), and a second shift register SR2 for selecting p ones (where p is a natural number smaller than or equal to n) of the n scan pulses Vout1 to Voutn from the first shift register SR1 in response to an external output control signal VEN and supplying the selected p scan pulses respectively to p gate lines of a liquid crystal panel.

That is, the first shift register SR1 sequentially outputs n+2 scan pulses Vout0 to Voutn+1 including dummy scan pulses Vout0 and Voutn+1, and the second shift register SR2 selects and outputs all or some of the n scan pulses Vout1 to Voutn, except the dummy scan pulses Vout0 and Voutn+1. At this time, the number of scan pulses selected by the second shift register SR2 varies with an enable duration ED of the output control signal VEN. That is, by adjusting the temporal position and size of a pulse width corresponding to the enable duration ED of the output control signal VEN, the second shift register SR2 can selectively supply desired ones of the n scan pulses Vout1 to Voutn outputted from the first shift register SR1 to gate lines.

To this end, the above-stated gate driver has a structure as follows.

Figure 2:
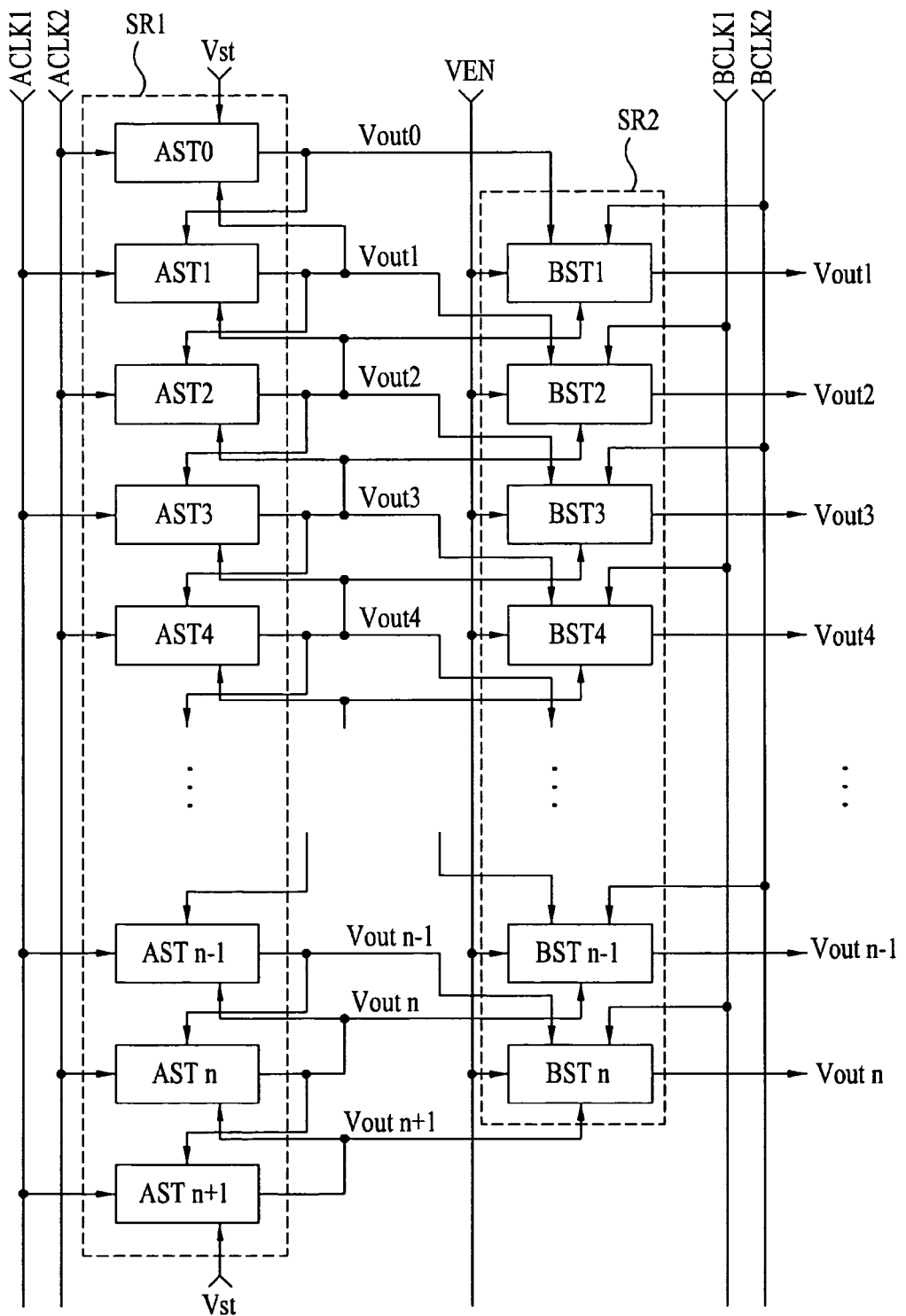
FIG. 2 is a detailed block diagram of the gate driver of FIG. 1.
Figure 3:
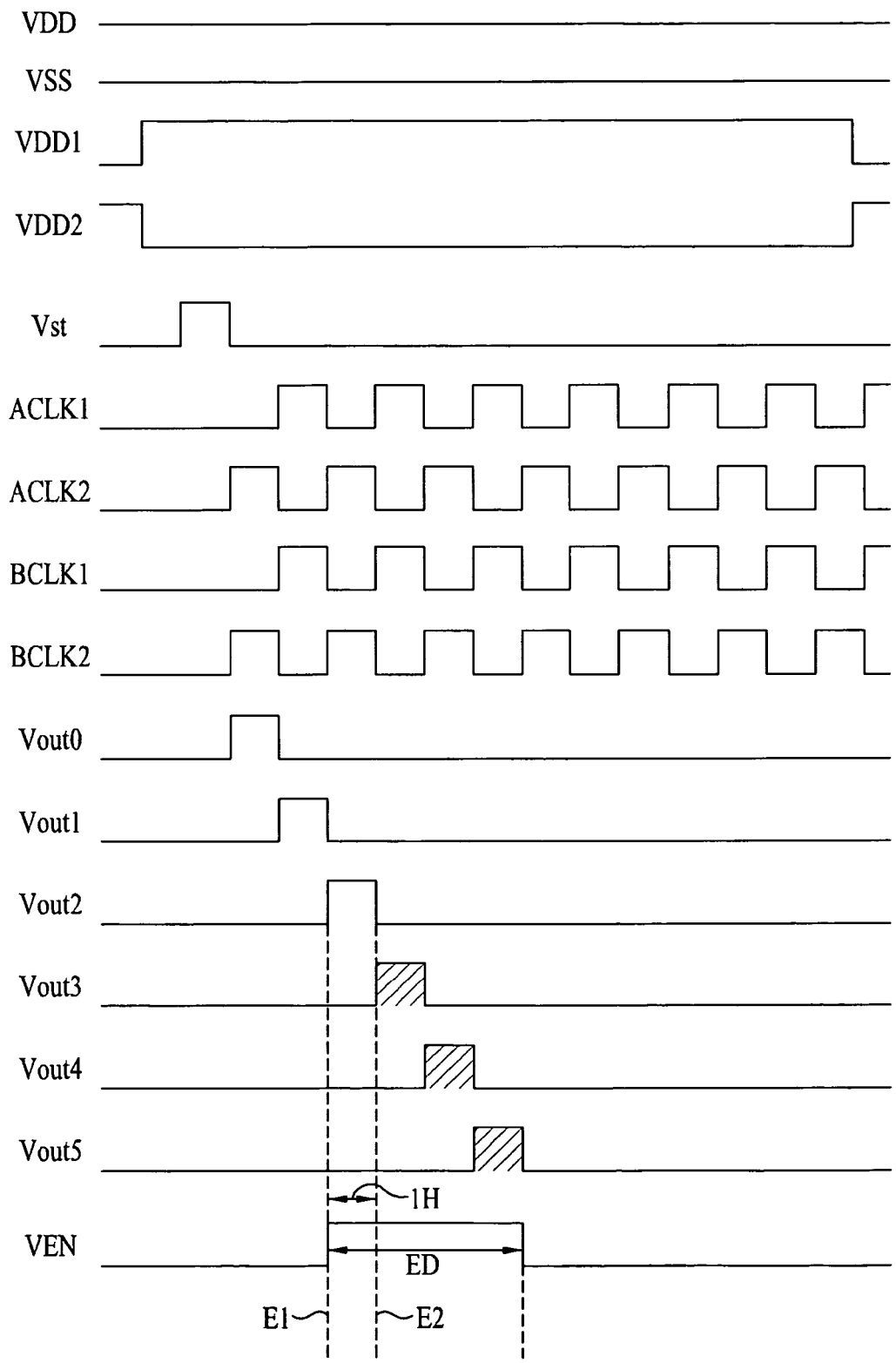
FIG. 3 and FIG. 4 are timing diagrams of various signals supplied to the gate driver of FIG. 2 and scan pulses outputted therefrom.
Figure 4:
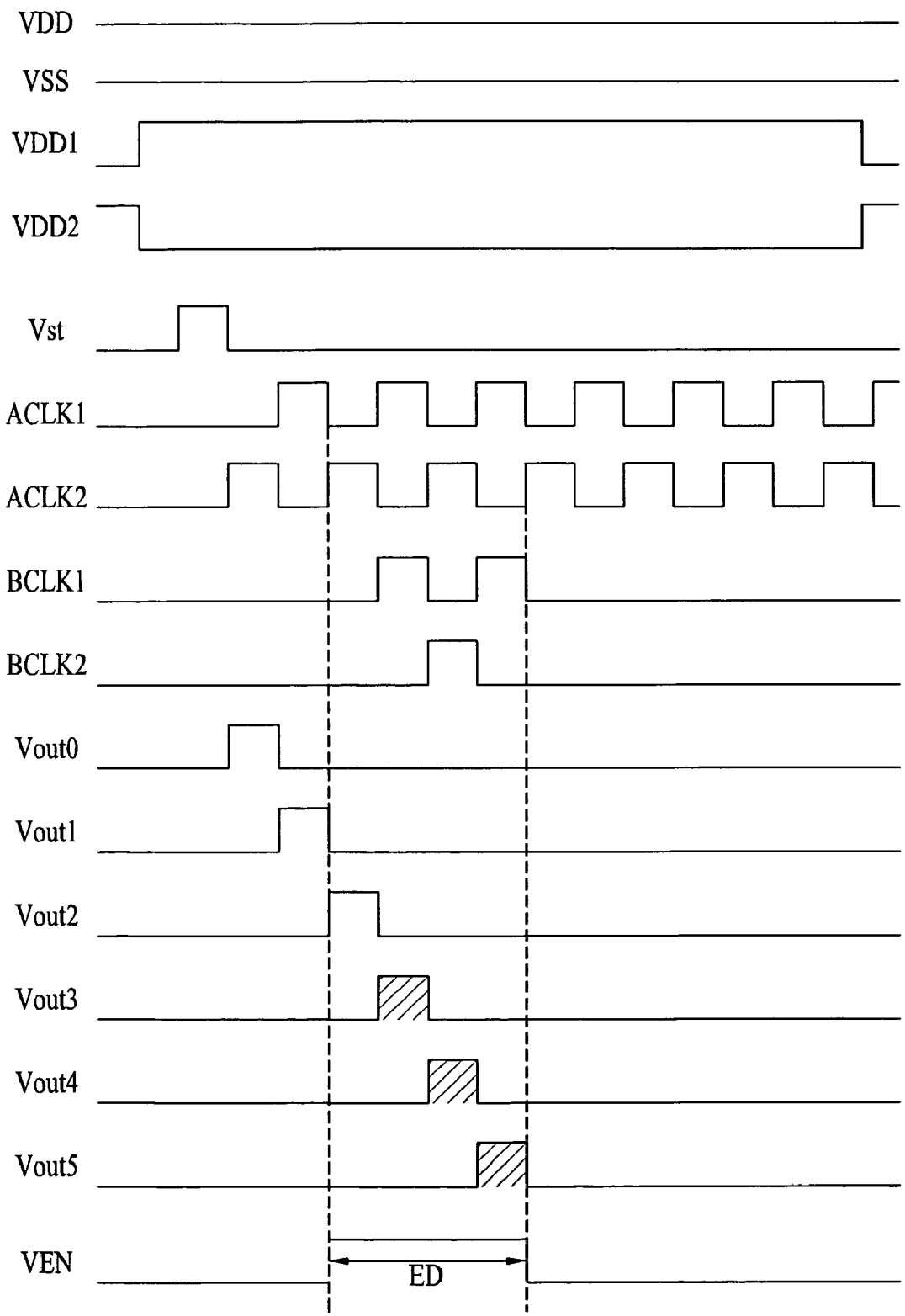

FIG. 2 is a detailed block diagram of the gate driver of FIG. 1, and FIG. 3 and FIG. 4 are timing diagrams of various signals supplied to the gate driver of FIG. 2 and scan pulses outputted therefrom.

The first shift register SR1 includes, as shown in FIG. 2, n A stages AST1 to ASTn for sequentially outputting n scan pulses Vout1 to Voutn based on any one of at least two types of A clock pulses ACLK1 and ACLK2 which are outputted sequentially out of phase with each other, an upper dummy stage AST0 for outputting an upper dummy scan pulse Vout0 based on any one of the A clock pulses ACLK1 and ACLK2, and a lower dummy stage ASTn+1 for outputting a lower dummy scan pulse Voutn+1 based on any one of the A clock pulses ACLK1 and ACLK2.

Each of all the stages AST0 to ASTn+1 provided in the first shift register SR1 is supplied with a charging voltage VDD, a discharging voltage VSS, a first alternating current (AC) voltage VDD1, a second AC voltage VDD2, and any one of first and second A clock pulses ACLK1 and ACLK2 which are outputted sequentially out of phase with each other and cyclically. On the other hand, the upper dummy stage AST0 and lower dummy stage ASTn+1 among all the stages AST0 to ASTn+1 are further supplied with a start pulse Vst.

The charging voltage VDD is provided from a charging voltage line, the discharging voltage VSS is provided from a discharging voltage line, the first A clock pulse ACLK1 is provided from a first clock transfer line, and the second A clock pulse ACLK2 is provided from a second clock transfer line. The start pulse Vst is provided from a start transfer line.

The charging voltage VDD and the discharging voltage VSS are both direct current (DC) voltages. The charging voltage VDD has a level higher than that of the discharging voltage VSS. For example, the charging voltage VDD may be positive and the discharging voltage VSS may be negative. On the other hand, the discharging voltage VSS may be a ground voltage. The discharging voltage VSS has the same voltage value as a low state voltage value of each of the clock pulses.

The A clock pulses ACLK1 and ACLK2 are signals which are used to generate scan pulses. Each of the A stages AST0 to ASTn+1 generates the corresponding scan pulse using any one of the A clock pulses ACLK1 and ACLK2. For example, the (2i+1)th A stage among the A stages outputs the corresponding scan pulse using the first A clock pulse ACLK1, and the (2i+2)th A stage among the A stages outputs the corresponding scan pulse using the second A clock pulse ACLK2. Here, i is a natural number including 0.

Although the two types of A clock pulses having different phases are used for illustrative purposes in the present invention, any number of types of A clock pulses may be used as long as they are two or more.

The first and second A clock pulses ACLK1 and ACLK2 are outputted out of phase with each another. The second A clock pulse ACLK2 is outputted after being phase-delayed by one pulse width from the first A clock pulse ACLK1. That is, the first A clock pulse ACLK1 and the second A clock pulse ACLK2 are 180° phase-inverted with respect to each other.

The start pulse Vst is outputted only once for one frame period, whereas each of the A clock pulses ACLK1 and ACLK2 is outputted several times for the one frame period. In other words, the start pulse Vst exhibits its active state (high state) only once for the one frame period, whereas each of the A clock pulses ACLK1 and ACLK2 exhibits its active state periodically several times for the one frame period.

The first and second AC voltages VDD1 and VDD2 are both AC voltages, and the first AC voltage VDD1 is 180° phase-inverted with respect to the second AC voltage VDD2. The high state voltage values of the first and second AC voltages VDD1 and VDD2 may be the same as the voltage value of the charging voltage VDD, and the low state voltage values of the first and second AC voltages VDD1 and VDD2 may be the same as the voltage value of the discharging voltage VSS. The states of the first and second AC voltages VDD1 and VDD2 are inverted at intervals of a period of m frames. Here, m is a natural number. The first AC voltage VDD1 is provided from a first AC voltage line, and the second AC voltage VDD2 is provided from a second AC voltage line.

A kth A stage ASTk is set in response to a scan pulse from a (k−1)th A stage and reset in response to a scan pulse from a (k+1)th A stage. When each stage is set, it can output a clock pulse supplied from a clock transfer line as a scan pulse. In contrast, when each stage is reset, it cannot output the clock pulse even though the clock pulse is supplied from the clock transfer line.

The second shift register SR2 includes, as shown in FIG. 2, n B stages BST1 to BSTn for receiving any one of at least two types of B clock pulses BCLK1 and BCLK2 which are outputted sequentially out of phase with each other, the n scan pulses Vout1 to Voutn from the A stages AST1 to ASTn, the upper dummy scan pulse Vout0 from the upper dummy stage AST0, and the lower dummy scan pulse Voutn+1 from the lower dummy stage ASTn+1. Here, a kth one BSTk (where k is a natural number) of the n B stages outputs the scan pulse from the kth one ASTk of the n A stages as any one of the B clock pulses BCLK1 and BCLK2 in response to the output control signal VEN.

Similarly, each of the B stages is supplied with the above-stated charging voltage VDD, discharging voltage VSS, first AC voltage VDD1 and second AC voltage VDD2. On the other hand, each of the B stages is supplied with any one of first and second B clock pulses BCLK1 and BCLK2 which are outputted sequentially out of phase with each other.

The B clock pulses BCLK1 and BCLK2 are signals which are used to generate scan pulses. Each of the B stages BST1 to BSTn generates the corresponding scan pulse using any one of the B clock pulses BCLK1 and BCLK2. For example, the (2i+1)th B stage among the B stages outputs the corresponding scan pulse using the first B clock pulse BCLK1, and the (2i+2)th B stage among the B stages outputs the corresponding scan pulse using the second B clock pulse BCLK2. Here, i is a natural number including 0.

Although the two types of B clock pulses having different phases are used for illustrative purposes in the present invention, any number of types of B clock pulses may be used as long as they are two or more.

The second B clock pulse BCLK2 is outputted after being phase-delayed by one pulse width from the first B clock pulse BCLK1. That is, the first B clock pulse BCLK1 and the second B clock pulse BCLK2 are 180° phase-inverted with respect to each other.

As shown in FIG. 3, the first B clock pulse BCLK1 and the first A clock pulse ACLK1 may be the same signal, and the second B clock pulse BCLK2 and the second A clock pulse ACLK2 may be the same signal. That is, only any one of a set of A clock pulses ACLK1 and ACLK2 and a set of B clock pulses BCLK1 and BCLK2 may be supplied to both the first and second shift registers SR1 and SR2. For example, the first and second shift registers SR1 and SR2 may be driven using only the first and second A clock pulses ACLK1 and ACLK2, without the first and second B clock pulses BCLK1 and BCLK2.

Each A stage outputs a scan pulse for an output period thereof. That is, only scan pulses from A stages whose output periods are located in the enable duration ED of the output control signal VEN where the output control signal VEN is maintained in a high state, among the n A stages, are supplied respectively to corresponding gate lines of the liquid crystal panel through corresponding B stages. A high edge point E1 of the enable duration ED of the output control signal VEN is ahead of a high edge point E2 of a high duration of a scan pulse outputted earliest in the enable duration ED. A time difference between the high edge point E1 of the enable duration ED of the output control signal VEN and the high edge point E2 of the high duration of the scan pulse outputted earliest in the enable duration ED corresponds to one horizontal time.

As shown in FIG. 3, the selection of only the third to fifth scan pulses Vout3 to Vout5 among all the scan pulses outputted from the A stages can be made by providing, to the B stages, the output control signal VEN which is maintained in the high state for a period including the scan pulse output period of the third A stage AST3, the scan pulse output period of the fourth A stage AST4 and the scan pulse output period of the fifth A stage AST5. At this time, the output control signal VEN assumes the high state earlier by one clock pulse width than the third scan pulse Vout3 outputted earliest in the enable duration ED exhibiting the high state of the output control signal VEN. This is for setting the third B stage BST3 that outputs the third scan pulse Vout3.

As shown in FIG. 3, the A clock pulses ACLK1 and ACLK2 are supplied to the A stages AST1 to ASTn, upper dummy stage AST0 and lower dummy stage ASTn+1 over the entire period including the enable duration ED of the output control signal VEN, and the B clock pulses BCLK1 and BCLK2 are supplied to the B stages BST1 to BSTn over the entire period including the enable duration ED of the output control signal VEN.

In an alternative embodiment, as shown in FIG. 4, the A clock pulses ACLK1 and ACLK2 may be supplied to the A stages AST1 to ASTn, upper dummy stage AST0 and lower dummy stage ASTn+1 over the entire period including the enable duration ED of the output control signal VEN, and the B clock pulses BCLK1 and BCLK2 may be supplied to the B stages BST1 to BSTn in only the enable duration ED of the output control signal VEN. This case is advantageous in that power consumption can be reduced because the first and second B clock pulses BCLK1 and BCLK2 are not supplied in a period where there is no output.

On the other hand, the upper dummy stage AST0 sets or resets the first A stage AST1 of the first shift register SR1 and the first B stage BST1 of the second shift register SR2 in response to the external start pulse Vst, and the lower dummy stage ASTn+1 resets or sets the nth A stage ASTn of the first shift register SR1 and the nth B stage BSTn of the second shift register SR2 in response to the start pulse Vst. The lower dummy stage ASTn+1 resets when the upper dummy stage AST0 sets, and sets when the upper dummy stage AST0 resets.

The n A stages provided in the first shift register SR1 are the same in configuration, and a detailed description will hereinafter be given of the configuration of the kth A stage ASTk.

Figure 5:
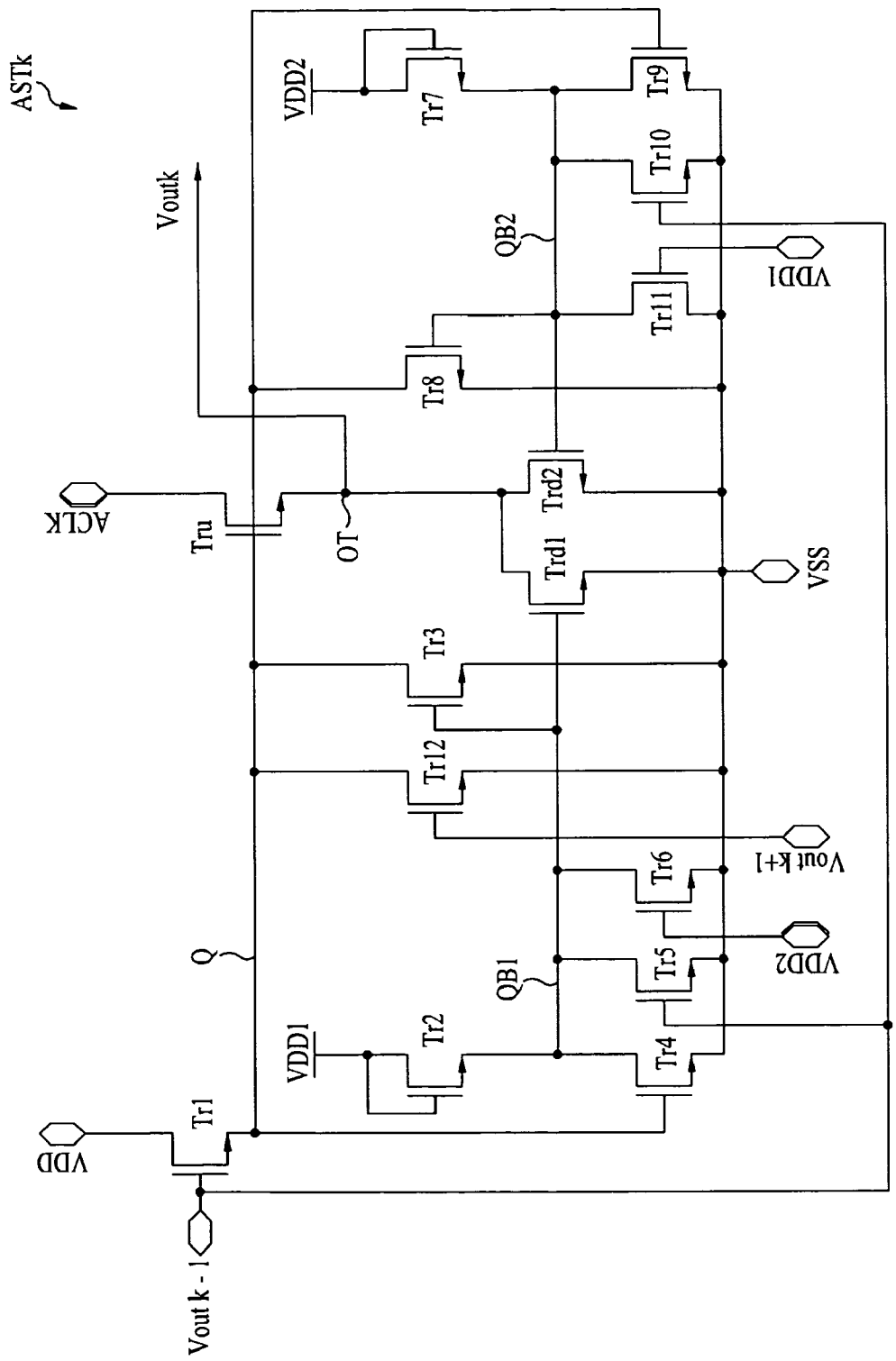
FIG. 5 is a circuit diagram of a kth A stage in FIG. 2.

FIG. 5 is a circuit diagram of the kth A stage ASTk in FIG. 2.

The kth A stage ASTk includes, as shown in FIG. 5, first to twelfth switching devices Tr1 to Tr12, a pull-up switching device Tru, a first pull-down switching device Trd1, and a second pull-down switching device Trd2.

The first switching device Tr1 is turned on or off in response to the scan pulse from the (k−1)th A stage, and interconnects a set node Q and the charging voltage line transferring the charging voltage VDD when being turned on.

The second switching device Tr2 is turned on or off in response to the first AC voltage VDD1 from the first AC voltage line, and interconnects the first AC voltage line and a first reset node QB1 when being turned on.

The third switching device Tr3 is turned on or off according to the voltage state of the first reset node QB1, and interconnects the set node Q and the discharging voltage line transferring the discharging voltage VSS when being turned on.

The fourth switching device Tr4 is turned on or off according to the voltage state of the set node Q, and interconnects the first reset node QB1 and the discharging voltage line when being turned on.

The fifth switching device Tr5 is turned on or off in response to the scan pulse from the (k−1)th A stage, and interconnects the first reset node QB1 and the discharging voltage line when being turned on.

The sixth switching device Tr6 is turned on or off in response to the second AC voltage VDD2 from the second AC voltage line, and interconnects the first reset node QB1 and the discharging voltage line when being turned on.

The seventh switching device Tr7 is turned on or off in response to the second AC voltage VDD2 from the second AC voltage line, and interconnects the second AC voltage line and a second reset node QB2 when being turned on.

The eighth switching device Tr8 is turned on or off according to the voltage state of the second reset node QB2, and interconnects the set node Q and the discharging voltage line when being turned on.

The ninth switching device Tr9 is turned on or off according to the voltage state of the set node Q, and interconnects the second reset node QB2 and the discharging voltage line when being turned on.

The tenth switching device Tr10 is turned on or off in response to the scan pulse from the (k−1)th A stage, and interconnects the second reset node QB2 and the discharging voltage line when being turned on.

The eleventh switching device Tr11 is turned on or off in response to the first AC voltage VDD1 from the first AC voltage line, and interconnects the second reset node QB2 and the discharging voltage line when being turned on.

The twelfth switching device Tr12 is turned on or off in response to the scan pulse from the (k+1)th A stage, and interconnects the set node Q and the discharging voltage line when being turned on.

The pull-up switching device Tru is turned on or off according to the voltage state of the set node Q, and interconnects a clock transfer line transferring any one of the A clock pulses ACLK1 and ACLK2 and an output terminal OT of the kth A stage ASTk when being turned on.

The first pull-down switching device Trd1 is turned on or off according to the voltage state of the first reset node QB1, and interconnects the output terminal OT of the kth A stage ASTk and the discharging voltage line when being turned on.

The second pull-down switching device Trd2 is turned on or off according to the voltage state of the second reset node QB2, and interconnects the output terminal OT of the kth A stage ASTk and the discharging voltage line when being turned on.

On the other hand, the upper dummy stage AST0 is substantially the same in circuit configuration as the above-stated kth A stage. However, because there is no stage upstream from the upper dummy stage AST0, the first switching device Tr1, fifth switching device Tr5 and tenth switching device Tr10 of the upper dummy stage AST0 are turned on or off by the start pulse Vst from a timing controller.

Also, the lower dummy stage ASTn+1 is substantially the same in circuit configuration as the above-stated kth A stage. However, because there is no stage downstream from the lower dummy stage ASTn+1, the twelfth switching device Tr12 of the lower dummy stage ASTn+1 is turned on or off by the start pulse Vst from the timing controller.

Hereinafter, the operation of the kth A stage ASTk with the above-stated circuit configuration will be described in detail with reference to FIG. 3 and FIG. 5.

In a first period, the scan pulse from the (k−1)th A stage is supplied to each of the gate electrodes of the first switching device Tr1, fifth switching device Tr5 and tenth switching device Tr10 of the kth A stage ASTk. As a result, the first, fifth and tenth switching devices Tr1, Tr5 and Tr10 are turned on. The charging voltage VDD is supplied to the set node Q of the kth A stage ASTk through the turned-on first switching device Tr1, so as to charge the set node Q. Accordingly, the pull-up switching device TRu, fourth switching device Tr4 and ninth switching device Tr9, connected to the charged set node Q through the gate electrodes thereof, are all turned on. The discharging voltage VSS is supplied to the first reset node QB1 through the turned-on fourth switching device Tr4, so as to discharge the first reset node QB1. Meanwhile, the first reset node QB1 is also supplied with the discharging voltage VSS outputted through the turned-on fifth switching device Tr5. As a result, the third switching device Tr1 and first pull-down switching device Trd1, connected to the discharged first reset node QB1 through the gate electrodes thereof, are turned off. Also, the discharging voltage VSS is supplied to the second reset node QB2 through the turned-on ninth switching device Tr9, so as to discharge the second reset node QB2. On the other hand, the second reset node QB2 is also supplied with the discharging voltage VSS outputted through the eleventh switching device Tr11 which is kept turned on for an odd frame period by the first AC voltage VDD1, which is always maintained in the high state for the odd frame period. Accordingly, the eighth switching device Tr8 and second pull-down switching device Trd2, connected to the discharged second reset node QB2 through the gate electrodes thereof, are turned off.

On the other hand, the second switching device Tr2 supplied with the first AC voltage VDD1 is also kept turned on for the odd frame period similarly to the eleventh switching device Tr11, and the first AC voltage VDD1 of the high state is supplied to the discharged first reset node QB1 through the turned-on second switching device Tr2. As a result, in the first period, the first AC voltage VDD1 of the high state and the discharging voltage VSS of the low state are together supplied to the first reset node QB1. At this time, the first reset node QB1 is kept discharged, because the area of each of the fourth and fifth switching devices Tr4 and Tr5 is set to be larger than that of the second switching device Tr2. Meanwhile, since the second AC voltage VDD2 is phase-inverted with respect to the first AC voltage VDD1, the seventh switching device Tr7, supplied with the second AC voltage VDD2 through the gate electrode thereof, is kept turned off for the odd frame period. Also, in this first period, the discharging voltage VSS is supplied from the (k+1)th A stage, so that the twelfth switching device Tr12, supplied with the discharging voltage VSS through the gate electrode thereof, is turned off.

In this manner, in the first period, the set node Q of the kth A stage ASTk is charged and the first and second reset nodes QB1 and QB2 thereof are discharged. That is, in the first period, the kth A stage ASTk is set.

Next, a description will be given of an operation in a second period.

In this second period, since the discharging voltage VSS is outputted from the (k−1)th A stage, the first switching device Tr1, fifth switching device Tr5 and tenth switching device Tr10 of the kth A stage ASTk, supplied with the discharging voltage VSS through the gate electrodes thereof, are turned off. As the first switching device Tr1 is turned off, the set node Q of the kth A stage ASTk is kept floating while holding the charging voltage VDD supplied in the first period.

Also, in this second period, any one of the A clock pulses ACLK1 and ACLK2 is supplied to the drain electrode of the turned-on pull-up switching device Tru. The pull-up switching device Tru is supplied with the first A clock pulse ACLK1 if the kth A stage ASTk is an odd A stage among the n A stages, and the second A clock pulse ACLK2 if the kth A stage ASTk is an even A stage among the n A stages.

A parasitic capacitor is formed between the drain electrode and gate electrode of the pull-up switching device Tru. At the moment that the A clock pulse is applied to the drain electrode of the pull-up switching device Tru, a voltage at the floating set node Q connected to the gate electrode of the pull-up switching device Tru is bootstrapped by the parasitic capacitor. Accordingly, the pull-up switching device Tru is kept almost completely turned on, and the A clock pulse is outputted as the scan pulse of the kth A stage ASTk through the turned-on pull-up switching device Tru.

This second period corresponds to the output period of the kth A stage ASTk. The scan pulse outputted from the kth A stage ASTk in the second period is supplied to the (k+1)th A stage to set the (k+1)th A stage and also to the (k−1)th A stage to reset the (k−1)th A stage.

Next, a description will be given of an operation in a third period.

This third period corresponds to the output period of the (k+1)th A stage, and the scan pulse outputted from the (k+1)th A stage is supplied to a (k+2)th A stage to set the (k+2)th A stage and also to the kth A stage ASTk to reset the kth A stage ASTk. The reset operation of the kth A stage ASTk will hereinafter be described in detail.

The scan pulse outputted from the (k+1)th A stage is supplied to the gate electrode of the twelfth switching device Tr12 of the kth A stage ASTk, so as to turn on the twelfth switching device Tr12. As a result, the discharging voltage VSS is supplied to the set node Q of the kth A stage ASTk through the turned-on twelfth switching device Tr12, so as to discharge the set node Q. Then, the pull-up switching device TRu, fourth switching device Tr4 and ninth switching device Tr9, connected to the discharged set node Q through the gate electrodes thereof, are all turned off. Meanwhile, in this third period, the discharging voltage VSS is supplied from the (k−1)th A stage, so that the fifth switching device Tr5 of the kth A stage ASTk, supplied with the discharging voltage VSS through the gate electrode thereof, is turned off. As the fourth and fifth switching devices Tr4 and Tr5 of the kth A stage ASTk are changed from their turned-on state to turned-off state and the second switching device Tr2 thereof remains turned on, the first reset node QB1 of the kth A stage ASTk is charged by the first AC voltage VDD1 of the high state supplied by the turned-on second switching device Tr2. Accordingly, the third switching device Tr3 and first pull-down switching device Trd1, connected to the charged first reset node QB1 through the gate electrodes thereof, are both turned on. The discharging voltage VSS is supplied to the set node Q through the turned-on third switching device Tr3, thereby causing the discharging of the set node Q to be accelerated. On the other hand, the discharging voltage VSS is outputted at the output terminal OT of the kth A stage ASTk through the turned-on first pull-down switching device Trd1.

Also, in this third period, the eleventh switching device Tr11 of the kth A stage ASTk is kept turned on, thereby causing the second reset node QB2 to remain discharged. As a result, the second pull-down switching device Tr2 and eighth switching device Tr8, connected to the discharged second reset node QB2 through the gate electrodes thereof, are kept turned off.

This third period is a reset period of the kth A stage ASTk. In this reset period, the first reset node QB1 of the kth A stage ASTk is charged and the set node Q and second reset node QB2 thereof are discharged. On the other hand, in an even frame period, the first AC voltage VDD1 is changed from the high state to the low state and the second AC voltage VDD2 is changed from the low state to the high state, so that the second reset node QB2 is charged in the reset operation of each A stage instead of the first reset node QB1. Accordingly, the second pull-down switching device Trd2 is operated instead of the first pull-down switching device Trd1. In this manner, the first pull-down switching device Trd1 and the second pull-down switching device Trd2 are alternately driven by frame periods, so that they can be prevented from being deteriorated.

The set operation, output operation and reset operation of any one A stage have been described, and the other A stages, not described, also perform the same operations. However, the upper dummy stage AST0 is set by the start pulse Vst from the timing controller, not by the scan pulse from the upstream A stage. Also, the lower dummy stage ASTn+1 is reset by the start pulse Vst from the timing controller, not by the scan pulse from the downstream A stage. Also, the first A stage AST1 is set by the upper dummy scan pulse Vout0 from the upper dummy stage AST0, and the nth A stage ASTn is reset by the lower dummy scan pulse Voutn+1 from the lower dummy stage ASTn+1.

All the stages AST0 to ASTn+1 provided in the first shift register SR1 sequentially output the scan pulses in the above manner. At this time, the upper dummy scan pulse Vout0 outputted from the upper dummy stage AST0 and the lower dummy scan pulse Voutn+1 outputted from the lower dummy stage ASTn+1 are carry signals that are not supplied to gate lines. That is, only the first to nth scan pulses Vout1 to Voutn outputted from the first to nth A stages AST1 to ASTn are used as scanning pulses to drive first to nth gate lines of the liquid crystal panel.

All the scan pulses including the upper dummy scan pulse Vout0 and lower dummy scan pulse Voutn+1, outputted from the first shift register SR1, are supplied to the second shift register SR2. Before describing the operation of the second shift register SR2, a detailed description will first be given of the circuit configurations of the B stages provided in the second shift register SR2.

Figure 6:
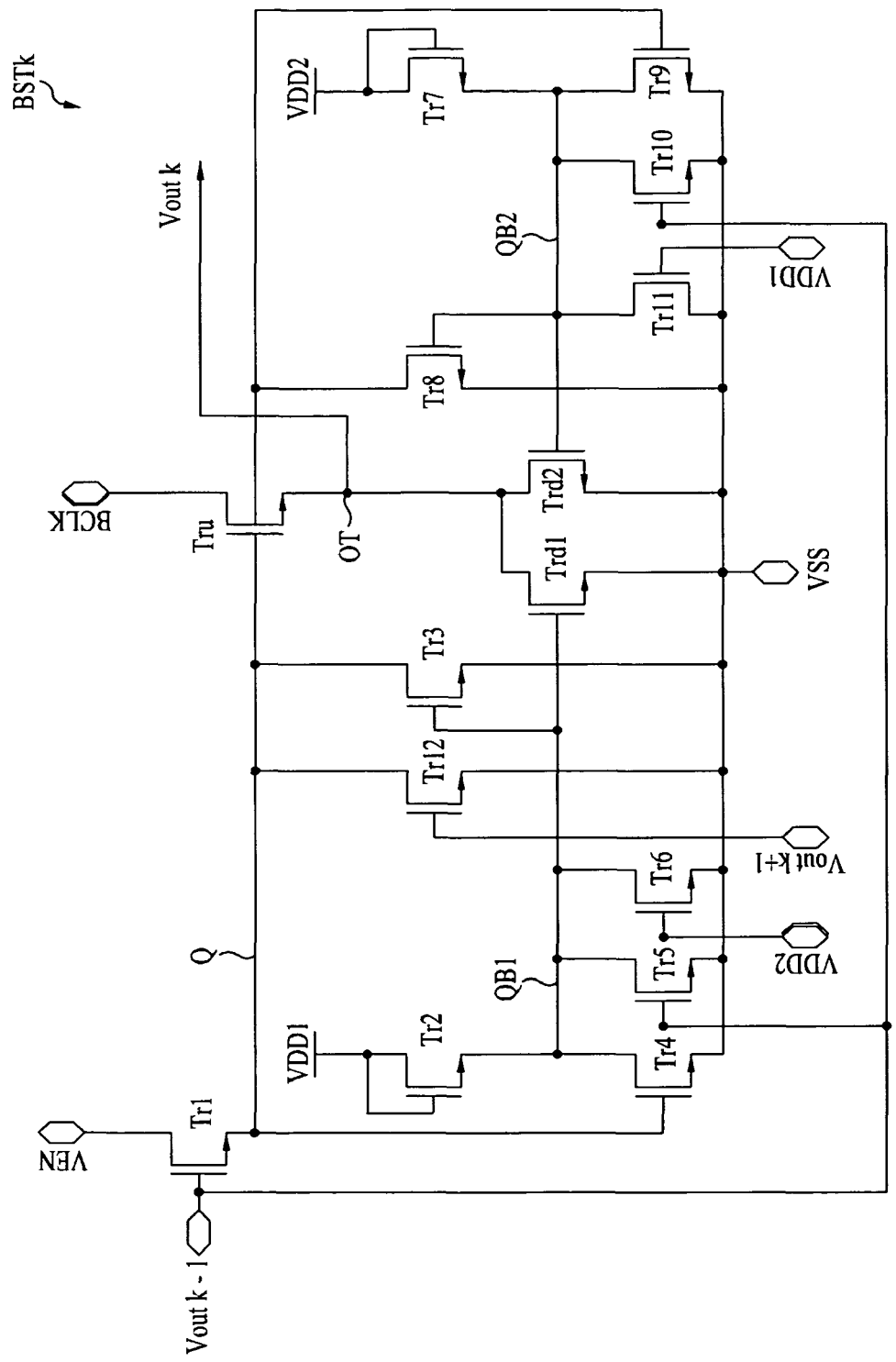
FIG. 6 is a circuit diagram of a kth B stage in FIG. 2.

FIG. 6 is a circuit diagram of the kth B stage BSTk in FIG. 2.

The kth B stage BSTk includes, as shown in FIG. 6, first to twelfth switching devices Tr1 to Tr12, a pull-up switching device Tru, a first pull-down switching device Trd1, and a second pull-down switching device Trd2.

The first switching device Tr1 is turned on or off in response to the scan pulse from the (k−1)th A stage, and interconnects a set node Q and a control signal line transferring the output control signal VEN when being turned on.

The second switching device Tr2 is turned on or off in response to the first AC voltage VDD1 from the first AC voltage line, and interconnects the first AC voltage line and a first reset node QB1 when being turned on.

The third switching device Tr3 is turned on or off according to the voltage state of the first reset node QB1, and interconnects the set node Q and the discharging voltage line transferring the discharging voltage VSS when being turned on.

The fourth switching device Tr4 is turned on or off according to the voltage state of the set node Q, and interconnects the first reset node QB1 and the discharging voltage line when being turned on.

The fifth switching device Tr5 is turned on or off in response to the scan pulse from the (k−1)th A stage, and interconnects the first reset node QB1 and the discharging voltage line when being turned on.

The sixth switching device Tr6 is turned on or off in response to the second AC voltage VDD2 from the second AC voltage line, and interconnects the first reset node QB1 and the discharging voltage line when being turned on.

The seventh switching device Tr7 is turned on or off in response to the second AC voltage VDD2 from the second AC voltage line, and interconnects the second AC voltage line and a second reset node QB2 when being turned on.

The eighth switching device Tr8 is turned on or off according to the voltage state of the second reset node QB2, and interconnects the set node Q and the discharging voltage line when being turned on.

The ninth switching device Tr9 is turned on or off according to the voltage state of the set node Q, and interconnects the second reset node QB2 and the discharging voltage line when being turned on.

The tenth switching device Tr10 is turned on or off in response to the scan pulse from the (k−1)th A stage, and interconnects the second reset node QB2 and the discharging voltage line when being turned on.

The eleventh switching device Tr11 is turned on or off in response to the first AC voltage VDD1 from the first AC voltage line, and interconnects the second reset node QB2 and the discharging voltage line when being turned on.

The twelfth switching device Tr12 is turned on or off in response to the scan pulse from the (k+1)th A stage, and interconnects the set node Q and the discharging voltage line when being turned on.

The pull-up switching device Tru is turned on or off according to the voltage state of the set node Q, and interconnects a clock transfer line transferring any one of the B clock pulses BCLK1 and BCLK2 and an output terminal OT of the kth B stage BSTk when being turned on.

The first pull-down switching device Trd1 is turned on or off according to the voltage state of the first reset node QB1, and interconnects the output terminal OT of the kth B stage BSTk and the discharging voltage line when being turned on.

The second pull-down switching device Trd2 is turned on or off according to the voltage state of the second reset node QB2, and interconnects the output terminal OT of the kth B stage BSTk and the discharging voltage line when being turned on.

On the other hand, the first switching device Tr1, fifth switching device Tr5 and tenth switching device Tr10 of the first B stage BST1 are turned on or off by the upper dummy scan pulse Vout0 from the upper dummy stage AST0.

Also, the twelfth switching device Tr12 of the nth B stage BSTn is turned on or off by the lower dummy scan pulse Voutn+1 from the lower dummy stage ASTn+1.

Hereinafter, the operation of the kth B stage BSTk with the above-stated circuit configuration will be described in detail with reference to FIG. 3 and FIG. 6.

In the first period, the scan pulse from the (k−1)th A stage is supplied to each of the gate electrodes of the first switching device Tr1, fifth switching device Tr5 and tenth switching device Tr10 of the kth B stage BSTk. As a result, the first, fifth and tenth switching devices Tr1, Tr5 and Tr10 are turned on. The output control signal VEN of the high state is supplied to the set node Q of the kth B stage BSTk through the turned-on first switching device Tr1, so as to charge the set node Q. Accordingly, the pull-up switching device TRu, fourth switching device Tr4 and ninth switching device Tr9, connected to the charged set node Q through the gate electrodes thereof, are all turned on. The discharging voltage VSS is supplied to the first reset node QB1 through the turned-on fourth switching device Tr4, so as to discharge the first reset node QB1. Meanwhile, the first reset node QB1 is also supplied with the discharging voltage VSS outputted through the turned-on fifth switching device Tr5. As a result, the third switching device Tr3 and first pull-down switching device Trd1, connected to the discharged first reset node QB1 through the gate electrodes thereof, are turned off. Also, the discharging voltage VSS is supplied to the second reset node QB2 through the turned-on ninth switching device Tr9, so as to discharge the second reset node QB2. On the other hand, the second reset node QB2 is also supplied with the discharging voltage VSS outputted through the eleventh switching device Tr11 which is kept turned on for the odd frame period by the first AC voltage VDD1, which is always maintained in the high state for the odd frame period. Accordingly, the eighth switching device Tr8 and second pull-down switching device Trd2, connected to the discharged second reset node QB2 through the gate electrodes thereof, are turned off.

On the other hand, the second switching device Tr2 supplied with the first AC voltage VDD1 is also kept turned on for the odd frame period similarly to the eleventh switching device Tr11, and the first AC voltage VDD1 of the high state is supplied to the discharged first reset node QB1 through the turned-on second switching device Tr2. As a result, in the first period, the first AC voltage VDD1 of the high state and the discharging voltage VSS of the low state are together supplied to the first reset node QB1. At this time, the first reset node QB1 is kept discharged, because the area of each of the fourth and fifth switching devices Tr4 and Tr5 is set to be larger than that of the second switching device Tr2. Meanwhile, since the second AC voltage VDD2 is phase-inverted with respect to the first AC voltage VDD1, the seventh switching device Tr7, supplied with the second AC voltage VDD2 through the gate electrode thereof, is kept turned off for the odd frame period. Also, in this first period, the discharging voltage VSS is supplied from the (k+1)th A stage, so that the twelfth switching device Tr12, supplied with the discharging voltage VSS through the gate electrode thereof, is turned off.

In this manner, in the first period, the set node Q of the kth B stage BSTk is charged and the first and second reset nodes QB1 and QB2 thereof are discharged. That is, in the first period, the kth B stage BSTk is set.

Provided that the output control signal VEN assumes the low state in the first period, the pull-up switching device TRu, fourth switching device Tr4 and ninth switching device Tr9, connected to the set node Q of the kth stage through the gate electrodes thereof, are all turned off because the output control signal VEN of the low state is supplied to the set node Q. As a result, the kth stage is not set, so that it cannot output a B clock pulse supplied thereto in the subsequent period as a scan pulse. The following description will be given on the assumption that the output control signal VEN assumes the high state.

Next, a description will be given of an operation in the second period.

In this second period, since the discharging voltage VSS is outputted from the (k−1)th A stage, the first switching device Tr1, fifth switching device Tr5 and tenth switching device Tr10 of the kth B stage BSTk, supplied with the discharging voltage VSS through the gate electrodes thereof, are turned off. As the first switching device Tr1 is turned off, the set node Q of the kth B stage BSTk is kept floating while holding the output control signal YEN of the high state supplied in the first period.

Also, in this second period, any one of the B clock pulses BCLK1 and BCLK2 is supplied to the drain electrode of the turned-on pull-up switching device Tru. The pull-up switching device Tru is supplied with the first B clock pulse BCLK1 if the kth B stage BSTk is an odd B stage among the n B stages, and the second B clock pulse BCLK2 if the kth B stage BSTk is an even B stage among the n B stages.

A parasitic capacitor is formed between the drain electrode and gate electrode of the pull-up switching device Tru. At the moment that the B clock pulse is applied to the drain electrode of the pull-up switching device Tru, a voltage at the floating set node Q connected to the gate electrode of the pull-up switching device Tru is bootstrapped by the parasitic capacitor. Accordingly, the pull-up switching device Tru is kept almost completely turned on, and the B clock pulse is outputted as the scan pulse of the kth B stage BSTk through the turned-on pull-up switching device Tru.

This second period corresponds to the output period of the kth B stage BSTk. The scan pulse outputted from the kth B stage BSTk in the second period is supplied to a kth gate line of the liquid crystal panel through the output terminal OT.

Next, a description will be given of an operation in the third period.

This third period corresponds to the output period of the (k+1)th A stage, and the scan pulse outputted from the (k+1)th A stage is supplied to a (k+2)th B stage to set the (k+2)th B stage and also to the kth B stage BSTk to reset the kth B stage BSTk. The reset operation of the kth B stage BSTk will hereinafter be described in detail.

The scan pulse outputted from the (k+1)th A stage is supplied to the gate electrode of the twelfth switching device Tr12 of the kth B stage BSTk, so as to turn on the twelfth switching device Tr12. As a result, the discharging voltage VSS is supplied to the set node Q of the kth B stage BSTk through the turned-on twelfth switching device Tr12, so as to discharge the set node Q. Then, the pull-up switching device TRu, fourth switching device Tr4 and ninth switching device Tr9, connected to the discharged set node Q through the gate electrodes thereof, are all turned off. Meanwhile, in this third period, the discharging voltage VSS is supplied from the (k−1)th A stage, so that the fifth switching device Tr5 of the kth B stage BSTk, supplied with the discharging voltage VSS through the gate electrode thereof, is turned off. As the fourth and fifth switching devices Tr4 and Tr5 of the kth B stage BSTk are changed from their turned-on state to turned-off state and the second switching device Tr2 thereof remains turned on, the first reset node QB1 of the kth B stage BSTk is charged by the first AC voltage VDD1 of the high state supplied by the turned-on second switching device Tr2. Accordingly, the third switching device Tr3 and first pull-down switching device Trd1, connected to the charged first reset node QB1 through the gate electrodes thereof, are both turned on. The discharging voltage VSS is supplied to the set node Q through the turned-on third switching device Tr3, thereby causing the discharging of the set node Q to be accelerated. On the other hand, the discharging voltage VSS is outputted to the kth gate line through the turned-on first pull-down switching device Trd1 and the output terminal OT of the kth B stage BSTk.

Also, in this third period, the eleventh switching device Tr11 of the kth B stage BSTk is kept turned on, thereby causing the second reset node QB2 to remain discharged. As a result, the second pull-down switching device Tr2 and eighth switching device Tr8, connected to the discharged second reset node QB2 through the gate electrodes thereof, are kept turned off.

This third period is a reset period of the kth B stage BSTk. In this reset period, the first reset node QB1 of the kth B stage BSTk is charged and the set node Q and second reset node QB2 thereof are discharged. On the other hand, in the even frame period, the first AC voltage VDD1 is changed from the high state to the low state and the second AC voltage VDD2 is changed from the low state to the high state, so that the second reset node QB2 is charged in the reset operation of each B stage instead of the first reset node QB1. Accordingly, the second pull-down switching device Trd2 is operated instead of the first pull-down switching device Trd1. In this manner, the first pull-down switching device Trd1 and the second pull-down switching device Trd2 are alternately driven by frame periods, so that they can be prevented from being deteriorated.

The set operation, output operation and reset operation of any one B stage have been described, and the other B stages, not described, also perform the same operations. However, the first B stage BST1 is set by the upper dummy scan pulse Vout0 from the upper dummy stage AST0, not by the scan pulse from the upstream A stage. Also, the nth B stage BSTn is reset by the lower dummy scan pulse Voutn+1 from the lower dummy stage ASTn+1, not by the scan pulse from the downstream A stage.

All the stages BST1 to BSTn provided in the second shift register SR2 sequentially output the scan pulses in the above manner. Notably, the B stages provided in the second shift register SR2 select and output all or some of the first to nth scan pulses from the A stages in response to the output control signal VEN. For example, in order to selectively drive only the third to fifth gate lines among the n gate lines and in order not to drive the remaining gate lines, as shown in FIG. 3, the output control signal VEN supplied to the B stages makes a low to high state transition at the time that the second scan pulse Vout2 from the second stage is outputted, namely, the second scan pulse Vout2 makes the low to high state transition. Then, the output control signal VEN is maintained in the high state until the fifth scan pulse Vout5 makes a high to low state transition, and thereafter makes the high to low state transition again.

In the case where the three gate lines are driven in order in this manner, only pixels connected to those three gate lines display images and pixels connected to the remaining gate lines display no image. In this case, it is preferable to periodically supply black data to the pixels displaying no image in advance before the start of one frame period.

As apparent from the above description, a gate driver according to the present invention has effects as follows.

The gate driver of the present invention has a second shift register capable of selectively outputting only desired ones of all scan pulses outputted from a first shift register. Therefore, it is possible to selectively drive desired gate lines to selectively display an image on only a desired portion of the entire screen of a liquid crystal panel.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A gate driver for partially driving a screen comprising: a first shift register for sequentially outputting n scan pulses, where n is a natural number larger than 2; and a second shift register for selecting p ones of the n scan pulses from the first shift register in response to an external output control signal and supplying the selected p scan pulses respectively to p gate lines of a liquid crystal panel, where p is a natural number smaller than or equal to n, wherein:

the first shift register comprises n A stages for sequentially outputting the n scan pulses based on any one of at least two types of A clock pulses which are outputted sequentially out of phase with each other, an upper dummy stage for outputting an upper dummy scan pulse based on any one of the A clock pulses, and a lower dummy stage for outputting a lower dummy scan pulse based on any one of the A clock pulses; and the second shift register comprises n B stages for receiving any one of at least two types of B clock pulses which are outputted sequentially out of phase with each other, the n scan pulses from the n A stages, the upper dummy scan pulse from the upper dummy stage, and the lower dummy scan pulse from the lower dummy stage, wherein a kth one of the n B stages outputs a scan pulse from a kth one of the n A stages as any one of the B clock pulses in response to the external output control signal, where k is a natural number.

2. The gate driver according to claim 1, wherein each of the n A stages outputs a corresponding one of the n scan pulses for an output period thereof, wherein only scan pulses from the n A stages whose output periods are located in an enable duration of the external output control signal where the external output control signal is maintained in a high state, among the n A stages, are supplied respectively to corresponding ones of the gate lines of the liquid crystal panel through corresponding ones of the n B stages.

3. The gate driver according to claim 2, wherein a high edge point of the enable duration of the external output control signal is ahead of a high edge point of a high duration of a scan pulse output earliest in the enable duration.

4. The gate driver according to claim 3, wherein a time difference between the high edge point of the enable duration of the external output control signal and the high edge point of the high duration of the scan pulse output earliest in the enable duration corresponds to one horizontal time.

5. The gate driver according to claim 2, wherein:
the A clock pulses are supplied to the n A stages, the upper dummy stage and the lower dummy stage over an entire period including the enable duration of the external output control signal; and
the B clock pulses are supplied to the n B stages in only the enable duration of the external output control signal.

6. The gate driver according to claim 2, wherein:
the A clock pulses are supplied to the n A stages, the upper dummy stage and the lower dummy stage over an entire period including the enable duration of the external output control signal; and
the B clock pulses are supplied to the n B stages over the entire period including the enable duration of the external output control signal.

7. The gate driver according to claim 6, wherein the A clock pulses and the B clock pulses are the same signals.

8. The gate driver according to claim 1, wherein:
the upper dummy stage sets or resets a first one of the n A stages of the first shift register and a first one of the n B stages of the second shift register in response to an external start pulse; and
the lower dummy stage resets or sets an nth one of the n A stages of the first shift register and an nth one of the n B stages of the second shift register in response to the start pulse,
wherein the lower dummy stage resets when the upper dummy stage sets, and sets when the upper dummy stage resets.

9. The gate driver according to claim 1, wherein a (k+1)th one of the n A stages comprises:
a first switching device turned on or off in response to the scan pulse from the kth A stage, the first switching device interconnecting a set node and a charging voltage line when being turned on, the charging voltage line transferring a charging voltage;
a second switching device turned on or off in response to a first alternating current (AC) voltage from a first AC voltage line, the second switching device interconnecting the first AC voltage line and a first reset node when being turned on;
a third switching device turned on or off according to a voltage state of the first reset node, the third switching device interconnecting the set node and a discharging voltage line when being turned on, the discharging voltage line transferring a discharging voltage;
a fourth switching device turned on or off according to a voltage state of the set node, the fourth switching device interconnecting the first reset node and the discharging voltage line when being turned on;
a fifth switching device turned on or off in response to the scan pulse from the kth A stage, the fifth switching device interconnecting the first reset node and the discharging voltage line when being turned on;
a sixth switching device turned on or off in response to a second AC voltage from a second AC voltage line, the sixth switching device interconnecting the first reset node and the discharging voltage line when being turned on;
a seventh switching device turned on or off in response to the second AC voltage from the second AC voltage line, the seventh switching device interconnecting the second AC voltage line and a second reset node when being turned on;
an eighth switching device turned on or off according to a voltage state of the second reset node, the eighth switching device interconnecting the set node and the discharging voltage line when being turned on;
a ninth switching device turned on or off according to the voltage state of the set node, the ninth switching device interconnecting the second reset node and the discharging voltage line when being turned on;
a tenth switching device turned on or off in response to the scan pulse from the kth A stage, the tenth switching device interconnecting the second reset node and the discharging voltage line when being turned on;
an eleventh switching device turned on or off in response to the first AC voltage from the first AC voltage line, the eleventh switching device interconnecting the second reset node and the discharging voltage line when being turned on;
a twelfth switching device turned on or off in response to a scan pulse from a (k+2)th one of the n A stages, the twelfth switching device interconnecting the set node and the discharging voltage line when being turned on;
a pull-up switching device turned on or off according to the voltage state of the set node, the pull-up switching device interconnecting a clock transfer line transferring any one of the A clock pulses and an output terminal of the (k+1)th A stage when being turned on;
a first pull-down switching device turned on or off according to the voltage state of the first reset node, the first pull-down switching device interconnecting the output terminal of the (k+1)th A stage and the discharging voltage line when being turned on; and
a second pull-down switching device turned on or off according to the voltage state of the second reset node, the second pull-down switching device interconnecting the output terminal of the (k+1)th A stage and the discharging voltage line when being turned on.

10. The gate driver according to claim 1, wherein a (k+1)th one of the n B stages comprises:
a first switching device turned on or off in response to the scan pulse from the kth A stage, the first switching device interconnecting a set node and a control signal line when being turned on, the control signal line transferring the external output control signal;

a second switching device turned on or off in response to a first AC voltage from a first AC voltage line, the second switching device interconnecting the first AC voltage line and a first reset node when being turned on;

a third switching device turned on or off according to a voltage state of the first reset node, the third switching device interconnecting the set node and a discharging voltage line when being turned on, the discharging voltage line transferring a discharging voltage;

a fourth switching device turned on or off according to a voltage state of the set node, the fourth switching device interconnecting the first reset node and the discharging voltage line when being turned on;

a fifth switching device turned on or off in response to the scan pulse from the kth A stage, the fifth switching device interconnecting the first reset node and the discharging voltage line when being turned on;

a sixth switching device turned on or off in response to a second AC voltage from a second AC voltage line, the sixth switching device interconnecting the first reset node and the discharging voltage line when being turned on;

a seventh switching device turned on or off in response to the second AC voltage from the second AC voltage line, the seventh switching device interconnecting the second AC voltage line and a second reset node when being turned on;

an eighth switching device turned on or off according to a voltage state of the second reset node, the eighth switching device interconnecting the set node and the discharging voltage line when being turned on;

a ninth switching device turned on or off according to the voltage state of the set node, the ninth switching device interconnecting the second reset node and the discharging voltage line when being turned on;

a tenth switching device turned on or off in response to the scan pulse from the kth A stage, the tenth switching device interconnecting the second reset node and the discharging voltage line when being turned on;

an eleventh switching device turned on or off in response to the first AC voltage from the first AC voltage line, the eleventh switching device interconnecting the second reset node and the discharging voltage line when being turned on;

a twelfth switching device turned on or off in response to a scan pulse from a (k+2)th one of the n A stages, the twelfth switching device interconnecting the set node and the discharging voltage line when being turned on;

a pull-up switching device turned on or off according to the voltage state of the set node, the pull-up switching device interconnecting a clock transfer line transferring any one of the B clock pulses and an output terminal of the (k+1)th B stage when being turned on;

a first pull-down switching device turned on or off according to the voltage state of the first reset node, the first pull-down switching device interconnecting the output terminal of the (k+1)th B stage and the discharging voltage line when being turned on; and a second pull-down switching device turned on or off according to the voltage state of the second reset node, the second pull-down switching device interconnecting the output terminal of the (k+1)th B stage and the discharging voltage line when being turned on.

* * * * *